United States Patent
Umezawa et al.

(10) Patent No.: US 10,204,766 B2
(45) Date of Patent: Feb. 12, 2019

(54) ION BEAM IRRADIATION APPARATUS AND SUBSTRATE PROCESSING APPARATUS

(71) Applicant: TOKYO ELECTRON LIMITED, Tokyo (JP)

(72) Inventors: Yoshihiro Umezawa, Miyagi (JP); Mitsunori Ohata, Miyagi (JP); Shinji Nagamachi, Hyogo (JP); Kenichi Shimono, Kyoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/785,500

(22) Filed: Oct. 17, 2017

(65) Prior Publication Data

US 2018/0108516 A1    Apr. 19, 2018

(30) Foreign Application Priority Data

Oct. 18, 2016    (JP) ................................. 2016-204174

(51) Int. Cl.
*H01J 37/32* (2006.01)

(52) U.S. Cl.
CPC .................... *H01J 37/32412* (2013.01); *H01J 2237/31701* (2013.01)

(58) Field of Classification Search
CPC .. H01J 37/00; H01J 37/02; H01J 37/30; H01J 37/3002; H01J 37/3007; H01J 37/3171; H01J 37/323; H01J 37/32412
USPC ............ 250/423 R, 424, 426, 453.11, 492.1, 250/492.3, 493.1, 494.1
See application file for complete search history.

(56) References Cited

U.S. PATENT DOCUMENTS

| | | | | |
|---|---|---|---|---|
| 5,218,210 A | * | 6/1993 | McIntyre, Jr. | H01J 37/08 250/423 R |
| 5,218,218 A | * | 6/1993 | Akazawa | H01L 27/10841 257/302 |
| 5,365,070 A | * | 11/1994 | Anderson | H01J 27/022 250/423 R |
| 6,559,454 B1 | * | 5/2003 | Murrell | H01J 27/022 250/423 R |
| 2004/0195524 A1 | * | 10/2004 | Yamauchi | H01J 37/3171 250/492.1 |

(Continued)

FOREIGN PATENT DOCUMENTS

JP    2007-173069 A    7/2007

*Primary Examiner* — Jason McCormack
(74) *Attorney, Agent, or Firm* — Rothwell, Figg, Ernst & Manbek, P.C.

(57) ABSTRACT

Disclosed is an ion beam irradiation apparatus including: a plurality of plate-like grid electrodes arranged in a beam irradiation direction so as to overlap each other and each having a plurality of apertures; a power supply unit that applies a voltage to each of the grid electrodes; and a controller that controls the voltage applied to each of the grid electrodes by the power supply unit. The plurality of grid electrodes include first to fourth grid electrodes. Central axes of apertures of the first grid electrode and apertures of the second grid electrode are coaxial along the beam irradiation direction, and a central axis of apertures of the third grid electrode is offset in a direction orthogonal to the beam irradiation direction with respect to the central axes of the apertures of the first grid electrode and the second grid electrode.

12 Claims, 13 Drawing Sheets

(56) References Cited

U.S. PATENT DOCUMENTS

2009/0114818 A1* 5/2009 Casares ................ H01J 37/045
                                                                          250/307

* cited by examiner

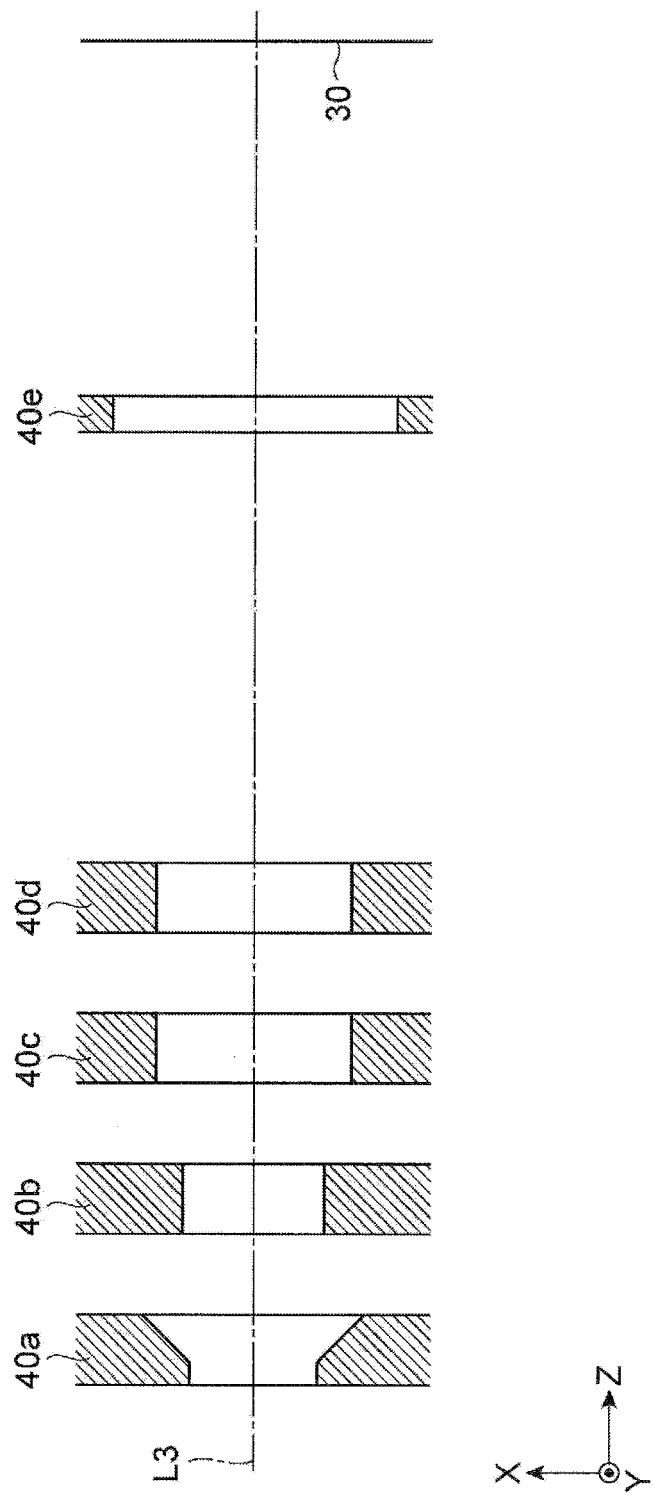

US 10,204,766 B2

ION BEAM IRRADIATION APPARATUS AND SUBSTRATE PROCESSING APPARATUS

CROSS-REFERENCE TO RELATED APPLICATIONS

This application is based on and claims priority from Japanese Patent Application No. 2016-204174 filed on Oct. 18, 2016 with the Japan Patent Office, the disclosure of which is incorporated herein in its entirety by reference.

TECHNICAL FIELD

The present disclosure relates to an ion beam irradiation apparatus and a substrate processing apparatus.

BACKGROUND

Japanese Patent Laid-Open Publication No. 2007-173069 discloses an electrode structure for irradiating a plurality of low energy ion beams. This electrode is constructed by stacking three metal electrode plates each having a plurality of apertures in an irradiation direction of ion beams.

SUMMARY

According to an aspect of the present disclosure, there is provided an ion beam irradiation apparatus which extracts and irradiates an ion beam from plasma. The apparatus includes a plurality of plate-like grid electrodes, a power supply unit, and a controller. The plurality of grid electrodes are arranged in a beam irradiation direction so as to overlap with each other, and each of the grid electrode has a plurality of apertures. The power supply unit applies a voltage to each of the grid electrodes. The controller controls the voltage applied to each of the grid electrodes by the power supply unit. The plurality of grid electrodes include a first grid electrode and a second grid electrode arranged first and second from the plasma in the beam irradiation direction, and a third grid electrode and a fourth grid electrode arranged on a downstream side of the second grid electrode in the beam irradiation direction, in this order. Central axes of apertures of the first grid electrode and apertures of the second grid electrode are coaxial along the beam irradiation direction. A central axis of apertures of the third grid electrode is offset in a direction orthogonal to the beam irradiation direction with respect to the central axes of the apertures of the first grid electrode and the second grid electrode.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a view for explaining a positional relationship of apertures of the grid electrodes.

DETAILED DESCRIPTION

Figure 1:
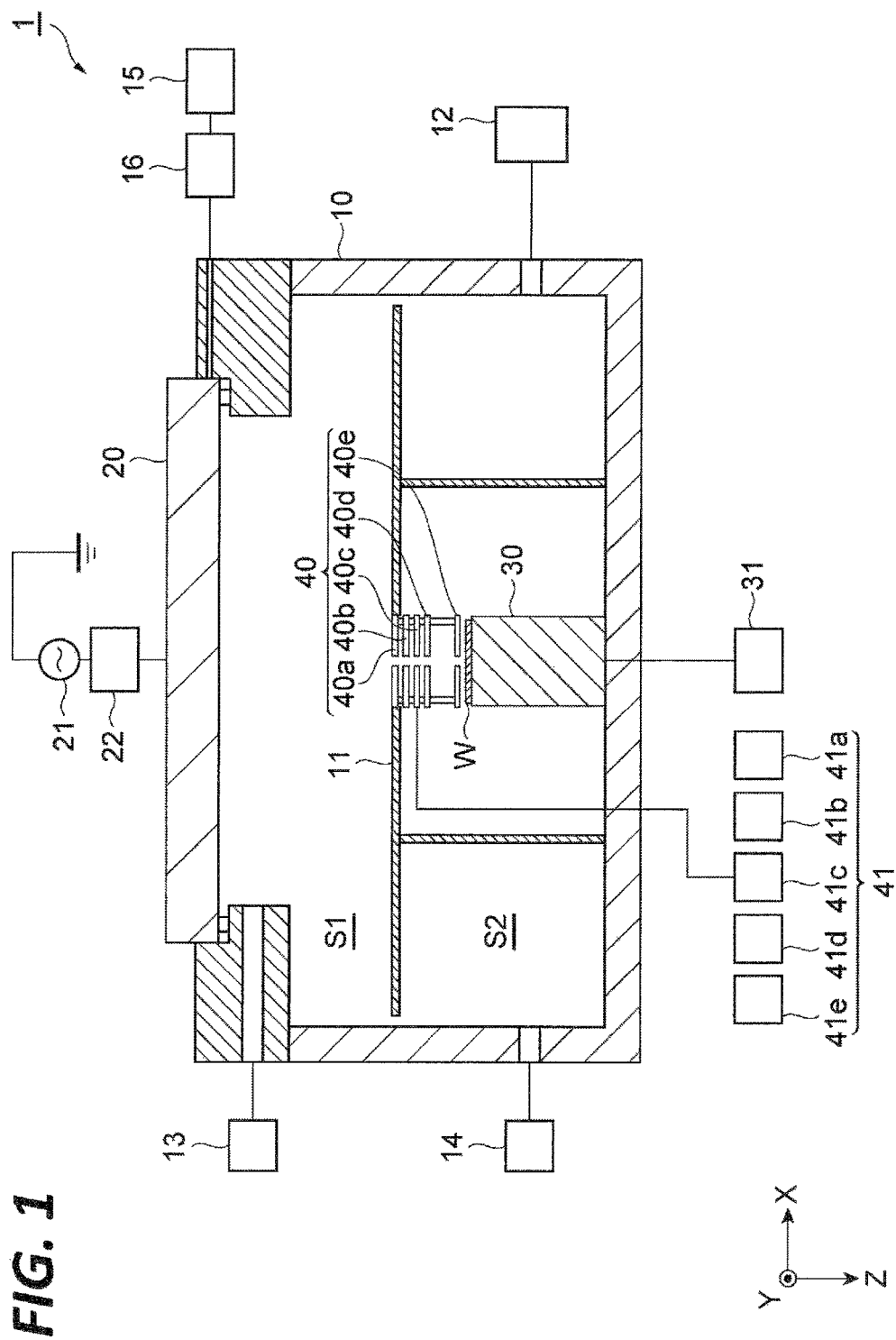
FIG. 1 is a schematic cross-sectional view illustrating a configuration of a substrate processing apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In an ion source for extracting a large beam size (e.g., about 100 mmφ to 500 mmφ) called a bucket type like the electrode structure described in Japanese Patent Laid-Open Publication No. 2007-173069, beam extraction is performed using a plurality of apertures (pores) under various conditions for extracting ion beams with good characteristics. Here, as the integration density of the semiconductor device is improved, it is required to control the directionality of the ion beams. The control of the directionality of an ion beam may be implemented by forming an electric or magnetic field in the space through which the beam passes in the case of a thin beam extracted from a single aperture (single hole). However, in a case of a large beam constituted by a plurality of ion beams extracted from a plurality of apertures (pores), it is difficult to control the directionality of the entire ion beams. For example, in the case of using an electric field, it is difficult to control the shape and the directionality of the entire ion beams because each ion beam is influenced by the acceleration and deceleration according to the position of the aperture from which the ion beam is extracted. Meanwhile, in the case of using a magnetic field, when a uniformly distributed magnetic field may be formed over the entire space through which the ion beams pass, it is possible to control the directionality of the entire ion beams. However, it is difficult and costly to strictly form a uniformly distributed magnetic field over the entire space through which the beams pass while taking the peripheral magnetic field into consideration.

Further, as the integration density of semiconductor devices is improved, it is also required to suppress damage caused to the material by the ion beams. The damage to the material may be suppressed by using low energy ion beams (e.g., 30 to 300 eV). However, as compared with high energy ion beams (e.g., 1,000 eV or more), the low energy ion beams have a remarkable influence such as collision with a residual gas and the effect of repulsion between ions. Thus, it is difficult to control the directionality of the ion beams. That is, when the ion beams extracted from the plurality of apertures described above are made low in energy, it tends to make it more difficult to control the directionality of the entire ion beams.

In the present technical field, there is a demand for an ion beam irradiation apparatus and a substrate processing apparatus that may easily control the directionality of the entire ion beams extracted from a plurality of apertures.

In order to effectively control the directionality of the entire ion beams extracted from a plurality of apertures, the present inventors have found that it is important to accurately extract the ion beams from the plasma and to control the directionality of the accurately extracted ion beams. Furthermore, the present inventors have found that the direction of the entire ion beams may be shifted (steered) in two directions including the offset direction and the reverse direction of the offset direction by offsetting the central axis of apertures of a predetermined grid electrode in a direction orthogonal to the beam irradiation direction with respect to the central axis of apertures of the other grid electrode and forming an electric field by the offset grid electrode, so that the present disclosure has been accomplished.

According to an aspect of the present disclosure, there is provided an ion beam irradiation apparatus which extracts and irradiates an ion beam from plasma. The apparatus includes a plurality of plate-like grid electrodes, a power supply unit, and a controller. The plurality of grid electrodes are arranged in a beam irradiation direction so as to overlap with each other, and each of the grid electrodes has a plurality of apertures. The power supply unit applies a voltage to each of the grid electrodes. The controller controls the voltage applied to each of the grid electrodes by the power supply unit. The plurality of grid electrodes includes a first grid electrode and a second grid electrode arranged first and second from the plasma in the beam irradiation direction and a third grid electrode and a fourth grid electrode arranged on a downstream side of the second grid electrode in the beam irradiation direction, in this order. Central axes of apertures of the first grid electrode and apertures of the second grid electrode are coaxial along the beam irradiation direction. A central axis of apertures of the third grid electrode is offset in a direction orthogonal to the beam irradiation direction with respect to the central axes of the apertures of the first grid electrode and the second grid electrode.

In the ion beam irradiation apparatus, since the central axes of the apertures of the first grid electrode and the second grid electrode arranged on the plasma side are coaxial, the apparatus may extract beams having a good shape, compared to a case where the central axes of the apertures of the first grid electrode and the second grid electrode do not coincide. In addition, in this apparatus, the central axis of the aperture of the third grid electrode to which a voltage is applicable is offset in the direction orthogonal to the beam irradiation direction with respect to the central axes of the aperture of the first grid electrode and the second grid electrode, and the electric field formed by the third grid electrode is controlled by the controller. Therefore, this apparatus may shift (steer) beams having a good shape in two directions, that is, the offset direction of the third grid electrode and the reverse direction of the offset direction. That is, this apparatus may control the directionality of the entire ion beams by only controlling the voltage without influencing the convergence characteristics of the ion beams extracted from the plurality of apertures, respectively. Therefore, this apparatus may easily control the directionality of the entire ion beams extracted from the plurality of apertures.

In an exemplary embodiment, the controller may impart a first potential difference between a grid electrode closest to the third grid electrode on an upstream side of the third grid electrode in the beam irradiation direction, among the plurality of grid electrodes, and the third grid electrode so as to tilt a plurality of ion beams irradiated from the plurality of apertures in an offset direction of the third grid electrode or in a reverse direction of the offset direction. In this case, the apparatus may use the first potential difference between the grid electrode on the upstream side closest to the third grid electrode and the third grid electrode as a parameter, and control the entire ion beams extracted from the plurality of apertures in the offset direction of the third grid electrode or the reverse direction of the offset direction.

In an exemplary embodiment, the controller may control the first potential difference to become large as a target tilt angle is increased when tilting the plurality of ion beams in the offset direction of the third grid electrode or the reverse direction of the offset direction. In this case, the controller may control the tilt angle of the entire ion beams extracted from the plurality of apertures with the first potential difference as a parameter.

In an exemplary embodiment, the controller may set the first potential difference to be negative when tilting the ion beams in the offset direction of the central axis of the apertures of the third grid electrode, and set the first potential difference to be positive when tilting the ion beams in the reverse direction of the offset direction of the central axis of the apertures of the third grid electrode. In this case, the controller may control the tilt direction of the entire ion beams extracted from the plurality of apertures with the positive or negative value of the first potential difference as a parameter.

In an exemplary embodiment, the apparatus may further include a fifth grid electrode arranged on a downstream side of the fourth grid electrode in the beam irradiation direction, and a central axis of apertures of the fourth grid electrode may be offset in a direction intersecting with the offset direction of the central axis of the apertures of the third grid electrode, as a direction orthogonal to the beam irradiation direction with respect to the central axes of the apertures of the first grid electrode and the second grid electrode. In this case, it is possible to perform not only the tilt direction control in the offset direction of the third grid electrode and the reverse direction thereof but also the tilt direction control in the offset direction of the fourth grid electrode and the reverse direction thereof. The offset direction of the fourth grid electrode is a direction different from the offset direction of the third grid electrode. Therefore, in this apparatus, the tilt direction of the entire ion beams extracted from the plurality of apertures may be freely controlled in a plane orthogonal to the beam irradiation direction.

In an exemplary embodiment, the controller may impart a second potential difference between a grid electrode closest to the fourth grid electrode on an upstream side of the fourth grid electrode in the beam irradiation direction, among the plurality of grid electrodes, and the fourth grid electrode so as to tilt a plurality of ion beams irradiated from the plurality of apertures in an offset direction of the fourth grid electrode or in a reverse direction of the offset direction. In this case, the apparatus may use the second potential difference between the grid electrode on the upstream side closest to the fourth grid electrode and the fourth grid electrode as a parameter, and control the entire ion beams extracted from the plurality of apertures in the offset direction of the fourth grid electrode or the reverse direction of the offset direction.

In an exemplary embodiment, the controller may control the second potential difference to become large as a target tilt angle is increased when tilting the plurality of ion beams in the offset direction of the fourth grid electrode or the reverse direction of the offset direction. In this case, the controller may control the tilt angle of the entire ion beams extracted from the plurality of apertures with the second potential difference as a parameter.

In an exemplary embodiment, the controller may set the second potential difference to be negative when tilting the ion beams in the offset direction of the central axis of the apertures of the fourth grid electrode, and set the second potential difference to be positive when tilting the ion beams in the reverse direction of the offset direction of the central axis of the apertures of the fourth grid electrode. In this case, the controller may control the tilt direction of the entire ion beams extracted from the plurality of apertures with the positive or negative value of the first potential difference as a parameter.

According to another aspect of the present disclosure, there is provided a substrate processing apparatus including the above-described ion beam irradiation apparatus and a placing table arranged in a beam irradiation direction of the ion bean irradiation apparatus and having a placing surface on which a substrate is held. In this case, the substrate processing apparatus has the same effect as that of the above-described ion beam irradiation apparatus.

In an exemplary embodiment, a region in which the plurality of apertures are formed in a grid electrode may be smaller than the area of the placing surface and have a shape of a quadrangle that is long in one direction. As described above, this apparatus may control the irradiation direction of the ion beam in an arbitrary direction. A substrate of an arbitrary size may be processed by moving the region in which the apertures are formed to the entire placing table.

According to various aspects and an exemplary embodiment of the present disclosure, there are provided an ion beam irradiation apparatus and a substrate processing apparatus that may easily control the directionality of the entire ion beams extracted from a plurality of apertures.

Hereinafter, various exemplary embodiments will be described in detail with reference to the drawings. In the respective drawings, the same or corresponding parts will be denoted by the same symbols.

First Exemplary Embodiment

FIG. 1 is a schematic cross-sectional view illustrating a configuration of a substrate processing apparatus according to a first exemplary embodiment. The substrate processing apparatus 1 illustrated in FIG. 1 is an apparatus that performs an etching processing by irradiating an ion beam to a substrate. The substrate processing apparatus 1 includes a substantially cylindrical processing container 10. The processing container 10 is made of, for example, aluminum the surface of which is anodized. The processing container 10 is grounded for safety. The inner space of the processing container 10 is partitioned into two spaces by a partition 11. The upper space is a plasma chamber S1 where plasma is generated, and the lower space is a processing chamber S2 where the substrate is processed. An exhaust device 12 is connected to the lower portion of the processing container 10 to decompress the inside of the processing container 10, and the pressures in the plasma chamber S1 and the processing chamber S2 are adjusted to predetermined pressures. The exhaust device 12 is a vacuum pump such as, for example, a turbo molecular pump. The pressure in the plasma chamber S1 is measured by a vacuum gauge 13, and the pressure in the processing chamber S2 is measured by a vacuum gauge 14.

A ceiling portion 20 of the processing container 10 is formed of a dielectric material. A coil for plasma generation (not illustrated) is provided in the ceiling portion 20. The coil is connected with a high frequency power supply 21 via a matcher 22. The plasma chamber S1 is connected with a gas source 15 for a plasma generation gas via a mass flow controller 16. The plasma generation gas is supplied from the gas source 15 to the plasma chamber S1, and a high frequency bias is applied to the coil by the high frequency power supply 21. Thus, plasma is generated in the plasma chamber S1.

A placing table 30 is provided in the bottom portion of the processing chamber S2. The placing table 30 includes a placing surface on which a substrate W is held. The placing table 30 is connected with a power supply 31. The power supply 31 may be a DC power supply or an AC power supply. A voltage is applied to the placing table 30, and an electric field for drawing ions to the substrate W is generated.

In the partition 11 that partitions the plasma chamber S1 and the processing chamber S2, a grid electrode 40 is arranged to extract an ion beam from the plasma and irradiate the ion beam to the substrate W. The grid electrode 40 is constituted by a plurality of plate-like grid electrodes 40a to 40e. The plurality of grid electrodes 40a to 40e are arranged apart from each other in a beam irradiation direction. The beam irradiation direction is a direction from the plasma chamber S1 toward the processing chamber S2 (Z direction). A power supply unit 41 (including power supplies 41a to 41e) is connected correspondingly to each of the plurality of grid electrodes 40a to 40e, and is capable of changing the voltage applied to each of the grid electrodes 40a to 40e. The power supply unit 41 may include AC power supplies only or DC power supplies only. For the connections in the figure, only the connection between the grid electrode 40c and the power supply 41c is illustrated, and the other connections are omitted. By these connections, the potential difference between the grid electrodes is independently adjusted. The ions of the ion beam extracted from the plasma are accelerated or decelerated in the space between the grid electrodes according to the potential difference between the grid electrodes. Therefore, the irradiation conditions of the ion beam are adjusted, and the ion beam is irradiated toward the substrate W under the adjusted irradiation conditions.

Figure 2A:
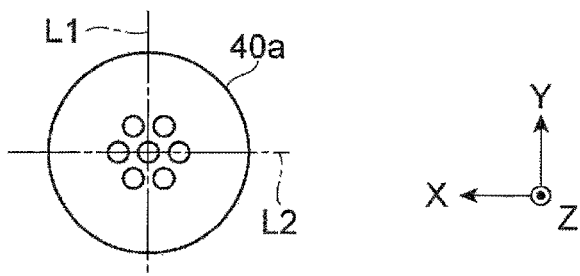
FIGS. 2A to 2E are views illustrating exemplary grid electrodes.
Figure 2B:
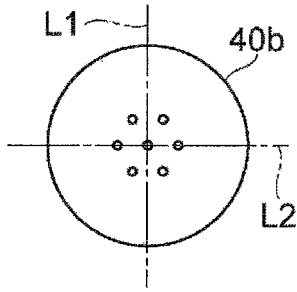
Figure 2C:
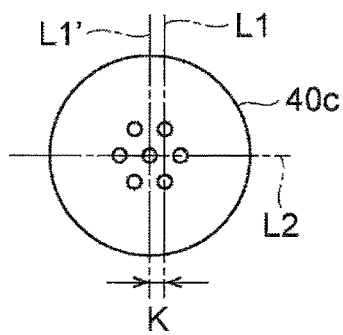
Figure 2D:
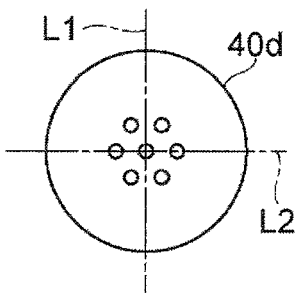
Figure 2E:
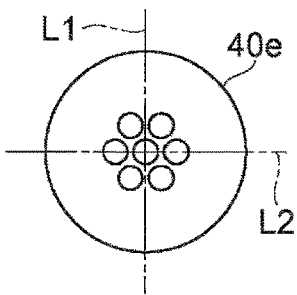

Next, the details of the grid electrode 40 will be described. FIGS. 2A to 2E are views illustrating an exemplary grid electrode 40. FIG. 2A illustrates a first grid electrode 40a arranged first from the plasma in the beam irradiation direction. FIG. 2B illustrates a second grid electrode 40b arranged second from the plasma in the beam irradiation direction. FIG. 2C illustrates a third grid electrode 40c arranged on the downstream side of the second grid electrode 40b in the beam irradiation direction. FIG. 2D illustrates a fourth grid electrode 40d arranged on the downstream side of the third grid electrode 40c in the beam irradiation direction. FIG. 2E illustrates an adjustment grid electrode 40e arranged on the downstream side of the fourth grid electrode 40d in the beam irradiation direction. The first grid electrode 40a, the second grid electrode 40b, the third grid electrode 40c, the fourth grid electrode 40d, and the adjustment grid electrode 40e illustrated in FIGS. 2A to 2E, respectively, are stacked in this order to form the grid electrode 40. The adjustment grid electrode 40e may not be provided, and the grid electrode 40 may be formed of at least four electrode plates.

As illustrated in FIGS. 2A to 2E, the grid electrodes 40a to 40e are substantially disk-shaped, and seven through-holes (apertures) are formed in each of the grid electrodes 40a to 40e. The apertures of the grid electrodes 40a to 40e are circular. FIG. 3 is a view for explaining a positional relationship of apertures of the grid electrodes. As illustrated in FIG. 3, the plurality of grid electrodes 40a to 40e are arranged such that the respective apertures overlap with each other in the beam irradiation direction (Z direction). Central axes L3 of the aperture of the first grid electrode 40a and the aperture of the second grid electrode 40b are coaxial along the beam irradiation direction. However, as illustrated in FIG. 2C, only the third grid electrode 40c is offset with respect to the other grid electrodes in a plane (XY plane) orthogonal to the irradiation direction. In FIGS. 2B to 2E, the central point of the first grid electrode 40a illustrated in FIG. 2A is indicated as an intersection point of line L1 and line L2. The third grid electrode 40c is offset in the X direction by a distance K with respect to the first grid electrode 40a. Further, the distance between the adjustment grid electrode 40e and a target is set to 5 mm to 100 mm.

Figure 4:
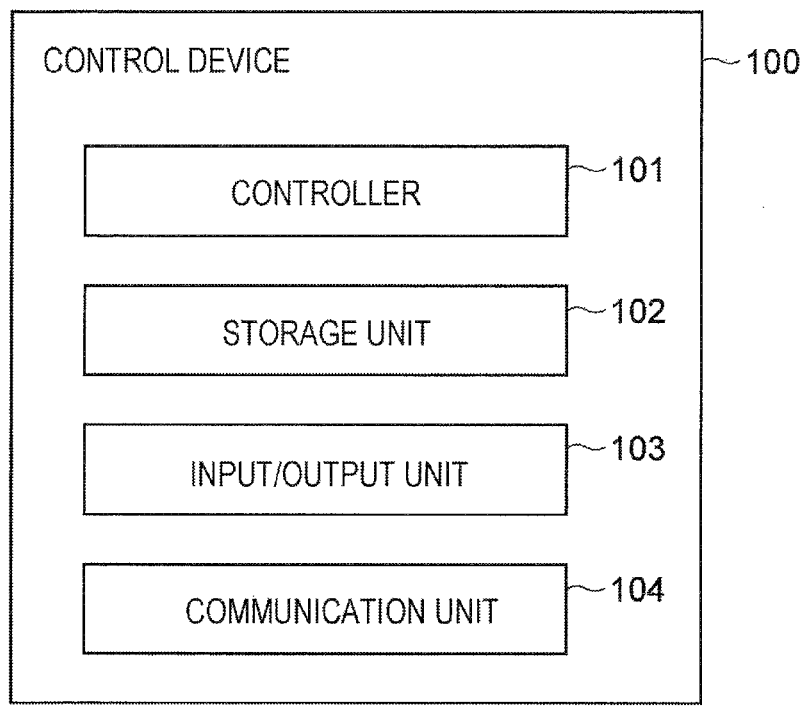
FIG. 4 is a functional block diagram of a control device of the substrate processing apparatus of FIG. 1.

Further, in an exemplary embodiment, the substrate processing apparatus 1 may further include a control device 100. FIG. 4 is a functional block diagram of the control device 100 of the substrate processing apparatus 1 of FIG. 1. As illustrated in FIG. 4, the control device 100 is a computer including a controller 101 (e.g., a processor), a storage unit 102 (e.g., a memory), an input/output unit 103 (e.g., an input device and a display device), and a communication unit 104 (e.g., a network card), and controls each part of the substrate processing apparatus 1, for example, a power supply system, a gas supply system, and a drive system. In the control device 100, an operator may execute an input operation of a command using the input device to manage the substrate processing apparatus 1, and may visualize and display the operation status of the substrate processing apparatus 1. Further, the storage unit 102 of the control device 100 stores a control program for controlling various processings to be performed in the substrate processing apparatus 1 by the processor, or a program for causing the respective parts of the substrate processing apparatus 1 to perform the processings in accordance with a processing condition, that is, a processing recipe.

The controller 101 controls a voltage applied to each of the grid electrodes 40a to 40e by the power supply unit 41. Since the first grid electrode 40a faces the plasma chamber, the first grid electrode 40a has the same potential as that of the plasma chamber S1. In order to extract an ion beam from the plasma chamber S1, the second grid electrode 40b is applied with a voltage such that a potential difference at which ions accelerate occurs between the first grid electrode 40a and the second grid electrode 40b. The applied voltage for extracting an ion beam having a good shape is determined by, for example, the plasma density and the shape of the electrode.

The controller 101 controls the potential difference between the second grid electrode (an example of the grid electrode closest to the third grid electrode on the upstream side of the third grid electrode in the beam irradiation direction) and the third grid electrode (the first potential difference) by controlling a voltage applied to the third grid electrode 40c. When a voltage is applied to the offset third grid electrode to impart the first potential difference, the center of the apertures between the second grid electrode 40b and the third grid electrode 40c is offset. Thus, a force acts obliquely on the ion beam. Therefore, the ion beam may be tilted. As the first potential difference increases, the force acting obliquely on the ion beam also increases. Therefore, the controller 101 controls the first potential difference to become large as a target tilt angle is increased when tilting a plurality of ion beams in the offset direction of the third grid electrode 40c or the reverse direction of the offset direction.

The controller 101 sets the first potential difference to be negative when tilting the ion beams in the offset direction of the central axis of the apertures of the third grid electrode 40c, and sets the first potential difference to be positive when tilting the ion beams in the reverse direction of the offset direction of the central axis of the apertures of the third grid electrode 40c. That is, the controller 101 may control the irradiation position of the ion beams in the one dimensional manner along the offset direction only by controlling the first potential difference. The controller 101 applies a voltage to the fourth grid electrode 40d, the adjustment grid electrode 40e, and the placing table 30 to impart an appropriate acceleration/deceleration to the ion beams.

The grid electrode 40, the power supply unit 41, and the controller 101 described above constitute an ion beam irradiation apparatus.

The results of simulation performed to demonstrate the above-described findings will be explained. FIGS. 5A to 5F are simulation results of ion beam steering. In FIGS. 5A to 5F, the aperture diameter of the first grid electrode 40a was set to 3.5 mmφ, the aperture diameter of the second grid electrode 40b was set to 4.0 mmφ, the aperture diameter of the third grid electrode 40c was set to 5.2 mmφ, the aperture of the fourth grid electrode 40d was set to 5.2 mmφ, and the aperture diameter of the adjustment grid electrode 40e was set to 8.0 mmφ. In addition, the distance between the first grid electrode 40a and the second grid electrode 40b was set to 2.5 mm, the distance between the second grid electrode 40b and the third grid electrode 40c was set to 2.0 mm, and the distance between the third grid electrode 40c and the fourth grid electrode 40d was set to 2.0 mm. The plasma density was set to $1\times10^{10}/cm^3$, the plasma potential was set to 26 V, the electron temperature was set to 2 eV, the voltage to be applied to the first grid electrode 40a was set to 0 V, the voltage to be applied to the second grid electrode 40b was set to −600 V, the voltage to be applied to the fourth grid electrode 40d was set to −500 V, the voltage to be applied to the adjustment grid electrode 40e was −700 V, and the voltage to be applied to the target was set to −500 V. The energy of the ion beam at this time was 500 eV. Further, the offset amount of the third grid electrode 40c was set to 0.4 mm in the X direction. Under the above-described conditions, the directionality of the ion beam was verified by changing the voltage of the third grid electrode 40c.

Figure 5:
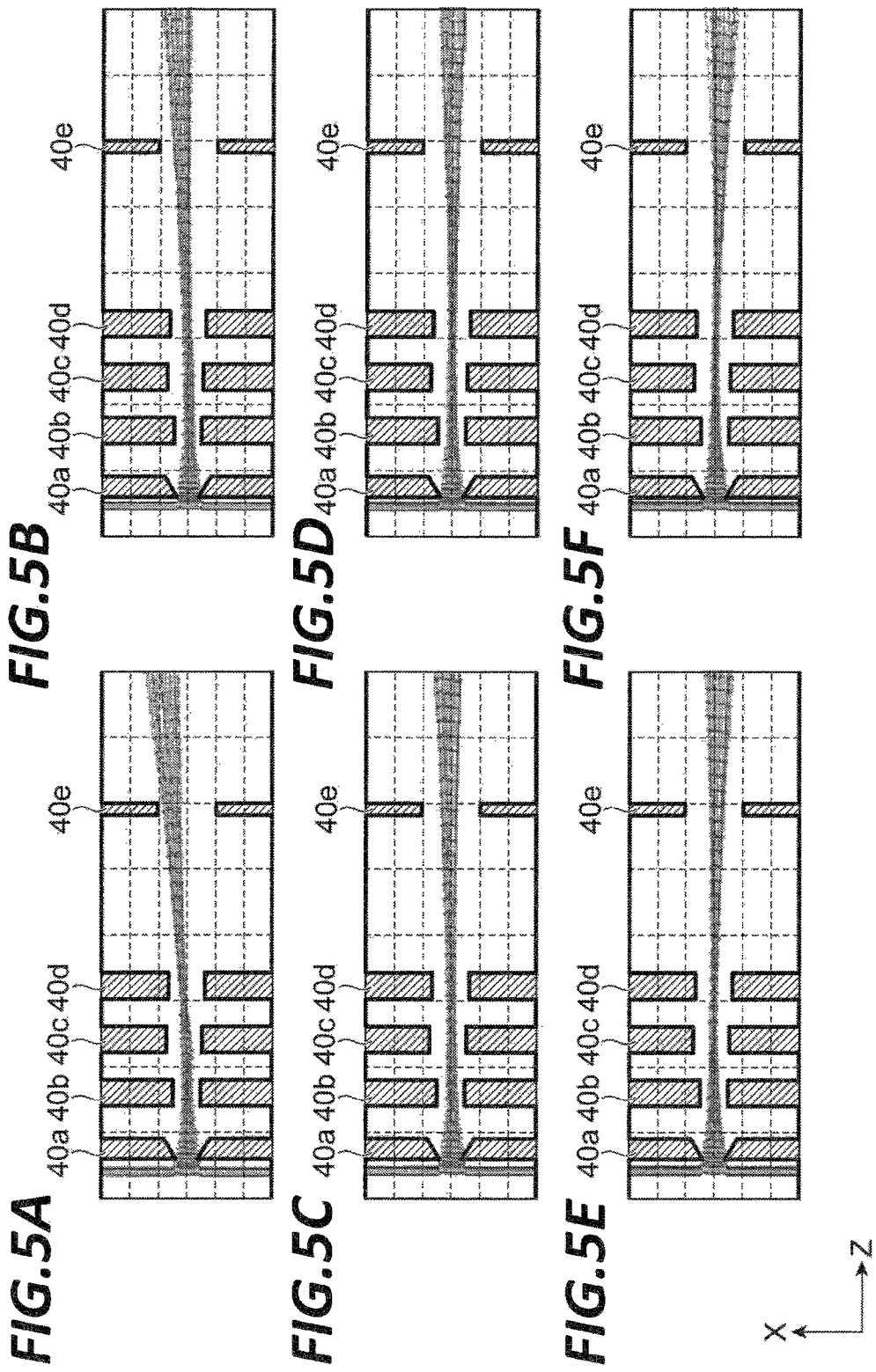
FIGS. 5A to 5F are simulation results of ion beam steering.

FIG. 5A illustrates a simulation result of the ion beam when the voltage to the third grid electrode 40c is 0 V. In FIG. 5A, the potential difference based on the second grid electrode 40b is −600 V. That is, it is a potential difference at which ions decelerate. At this time, it was confirmed that the ion beam was tilted in the offset direction.

FIG. 5B illustrates a simulation result of the ion beam when the voltage to the third grid electrode 40c is −200 V. In FIG. 5B, the potential difference based on the second grid electrode 40b is −400 V. That is, it is a potential difference at which ions decelerate. At this time, it was confirmed that the ion beam was tilted in the offset direction.

FIG. 5C illustrates a simulation result of the ion beam when the voltage to the third grid electrode 40c is −400 V. In FIG. 5C, the potential difference based on the second grid electrode 40b is −200 V. That is, it is a potential difference at which ions decelerate. At this time, it was confirmed that the ion beam was tilted in the offset direction.

FIG. 5D illustrates a simulation result of the ion beam when the voltage to the third grid electrode 40c is −600 V. In FIG. 5D, the potential difference based on the second grid electrode 40b is 0 V. That is, it is a potential difference at which ions do not accelerate or decelerate. At this time, it was confirmed that the ion beam was not tilted.

FIG. 5E illustrates a simulation result of the ion beam when the voltage to the third grid electrode 40c is −800 V. In FIG. 5E, the potential difference based on the second grid electrode 40b is +200 V. That is, it is a potential difference at which ions accelerate. At this time, it was confirmed that the ion beam was tilted in the reverse direction of the offset direction.

FIG. 5F illustrates a simulation result of the ion beam when the voltage to the third grid electrode 40c is −1,000 V. In FIG. 5F, the potential difference based on the second grid electrode 40b is +400 V. That is, it is a potential difference at which ions accelerate. At this time, it was confirmed that the ion beam was tilted in the reverse direction of the offset direction.

Figure 6:
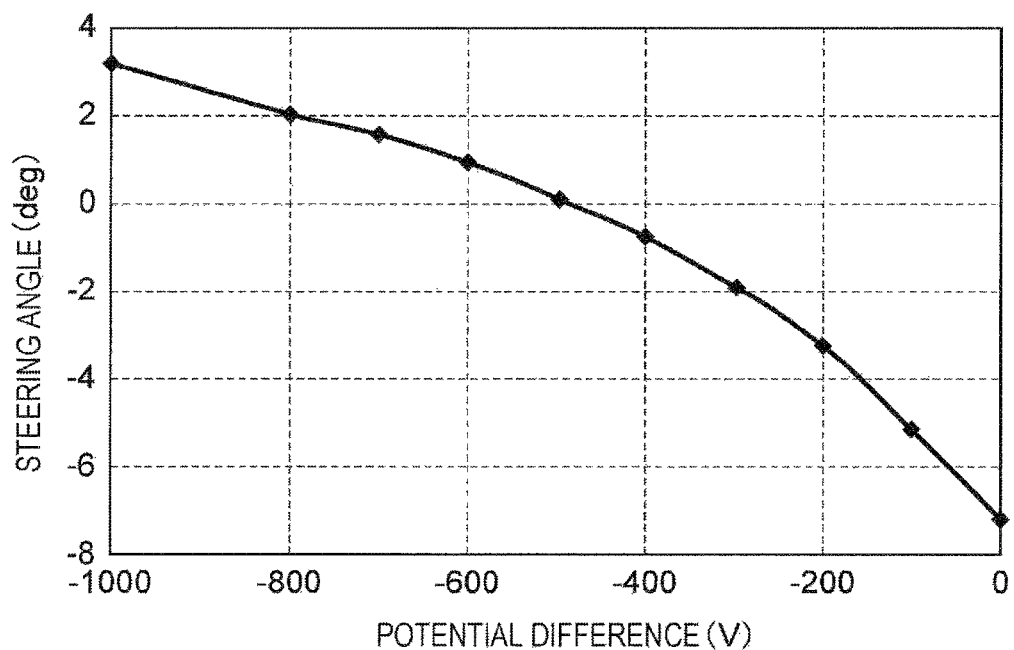
FIG. 6 is a simulation result illustrating a relationship between a steering angle and a potential difference.

FIG. 6 is a simulation result illustrating a relationship between a steering angle (tilt angle) and a potential difference. FIG. 6 is a result obtained by summarizing the tilt angles and the potential differences in FIGS. 5A to 5F in one graph. As illustrated in FIG. 6, it has been confirmed that it is necessary to set the first potential difference to be negative when tilting the ion beams in the offset direction of the central axis of the apertures of the third grid electrode 40c, and set the first potential difference to be positive when tilting the ion beams in the reverse direction of the offset direction of the central axis of the apertures of the third grid electrode 40c. Furthermore, it has been confirmed that the tilt angle increases as the potential difference increases.

The simulation result in FIG. 6 is a result when the ion beam energy is 526 eV. Even for low energy ion beams, it was verified whether or not simulation results with similar trends were obtained. FIGS. 7A and 7B, 8A and 8B, and 9A and 9B are simulation results of low energy ion beam steering. In FIGS. 7A and 7B, 8A and 8B, and 9A and 9B, the aperture diameter of the grid electrode 40, the interval of the grid electrodes 40, and the offset amount of the third grid electrode 40c were the same as in the simulation of FIGS. 5A to 5F. The plasma density was set to $0.7 \times 10^{10}/cm^3$, the plasma potential was set to 26 V, the electron temperature was set to 2 eV, the voltage to be applied to the first grid electrode 40a was set to 0 V, the voltage to be applied to the second grid electrode 40b was set to −500 V, the voltage to be applied to the fourth grid electrode 40d was set to −350 V, the voltage to be applied to the adjustment grid electrode 40e was set to −300 V, and the voltage to be applied to the target was set to −70 V. The energy of the ion beam at this time was 96 eV. Under the above-described conditions, the directionality of the ion beam was verified by setting the voltage of the third grid electrode 40c to −300 V, −100 V, and −900 V.

Figure 7A:
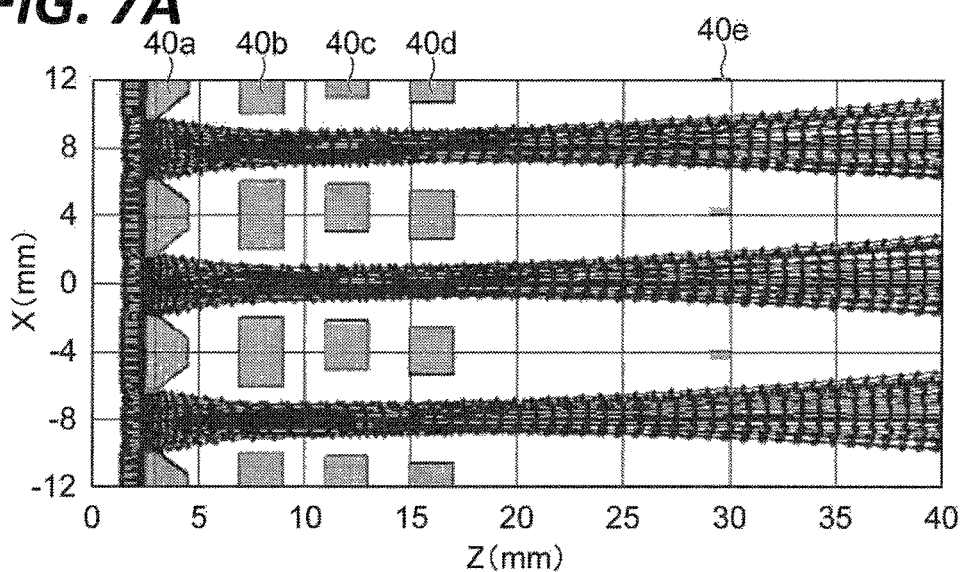
FIGS. 7A and 7B are simulation results of low energy ion beam steering.
Figure 7B:
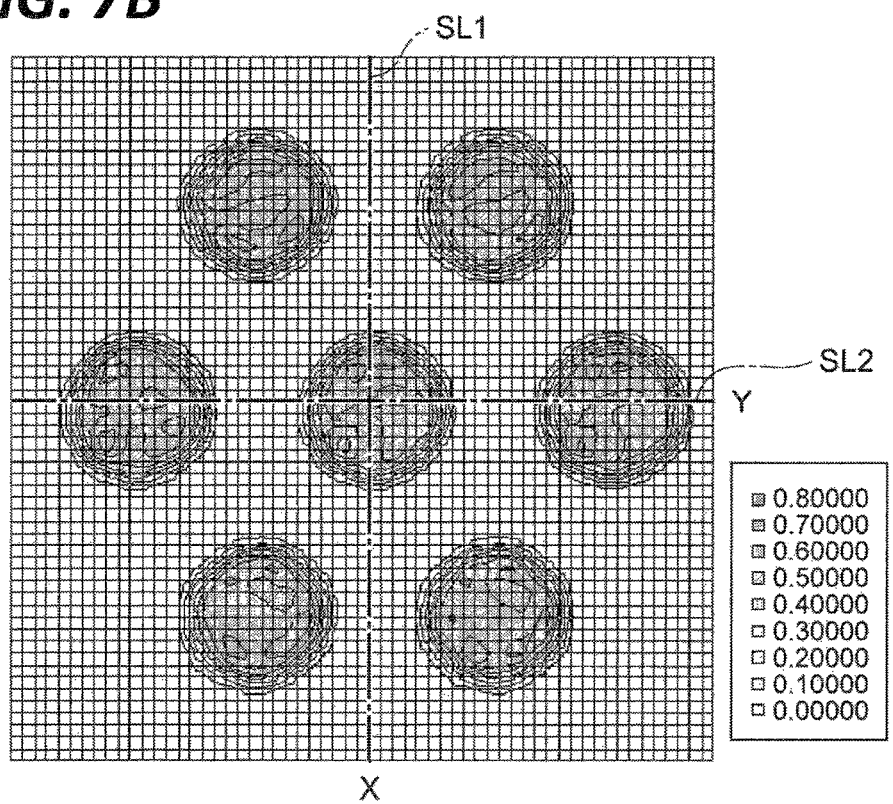

FIG. 7A is a simulation result of the ion beam when the voltage of the third grid electrode 40c is set to −300 V. FIG. 7B illustrates distribution of a beam current density ($A/m^2$) on the sample surface (XY plane), and the beam current density (0.00000 $A/m^2$ to 0.80000 $A/m^2$) is indicated by contour lines. Reference lines SL1 and SL2 indicate the central point of the aperture diameter of the first grid electrode 40a on the sample surface. The intersection point of the reference lines SL1 and SL2 corresponds to the point obtained by projecting the central point of the aperture diameter of the first grid electrode 40a on the sample surface. In FIGS. 7A and 7B, the potential difference based on the second grid electrode 40b is −200 V. That is, it is a potential difference at which ions decelerate. At this time, as illustrated in FIG. 7A, it was confirmed that the ion beam was slightly tilted in the offset direction (X positive direction). Further, as illustrated in FIG. 7B, it was confirmed that the beam spot position represented by the beam current density distribution was also positioned slightly closer to the offset direction (X positive direction) than the reference line SL1.

Figure 8A:
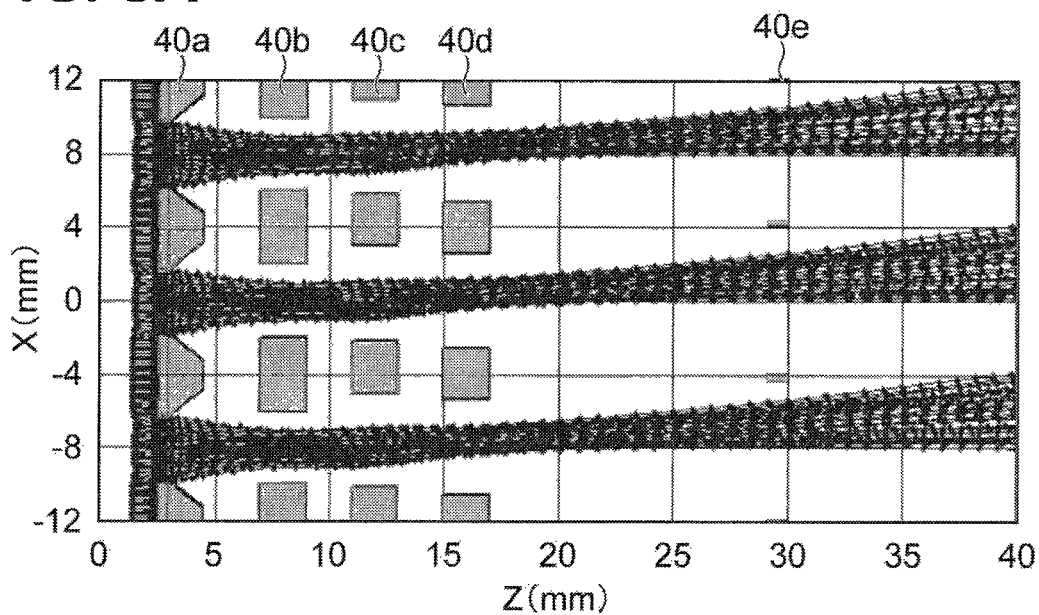
FIGS. 8A and 8B are simulation results of low energy ion beam steering.
Figure 8B:
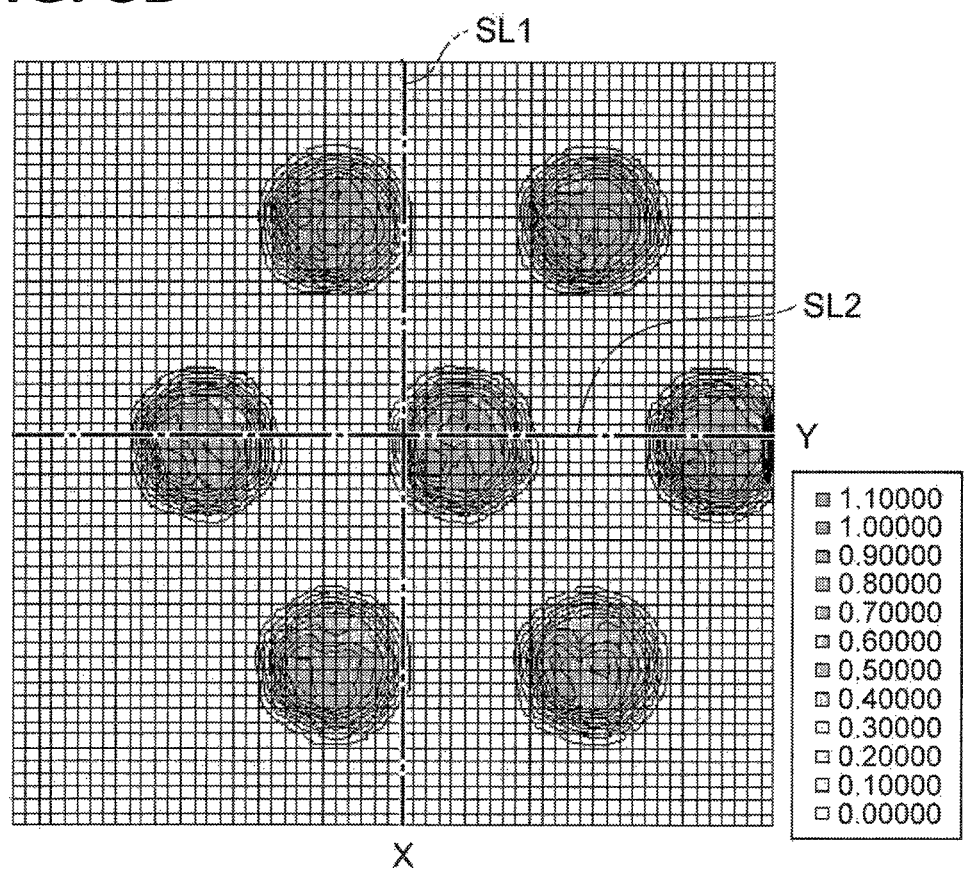

FIG. 8A is a simulation result of the ion beam when the voltage of the third grid electrode 40c is set to −100 V. FIG. 8B illustrates distribution of a beam current density ($A/m^2$) on the sample surface (XY plane), and the beam current density (0.00000 $A/m^2$ to 1.10000 $A/m^2$) is indicated by contour lines. Reference lines SL1 and SL2 indicate the central point of the aperture diameter of the first grid electrode 40a on the sample surface. The intersection point of the reference lines SL1 and SL2 corresponds to the point obtained by projecting the central point of the aperture diameter of the first grid electrode 40a on the sample surface. In FIGS. 8A and 8B, the potential difference based on the second grid electrode 40b is −400 V. That is, it is a potential difference at which ions decelerate. At this time, as illustrated in FIG. 8A, it was confirmed that the ion beam was tilted in the offset direction (X positive direction). Further, as illustrated in FIG. 8B, it was confirmed that the beam spot position represented by the beam current density distribution was also positioned closer to the offset direction (X positive direction) than the reference line SL1.

Figure 9A:
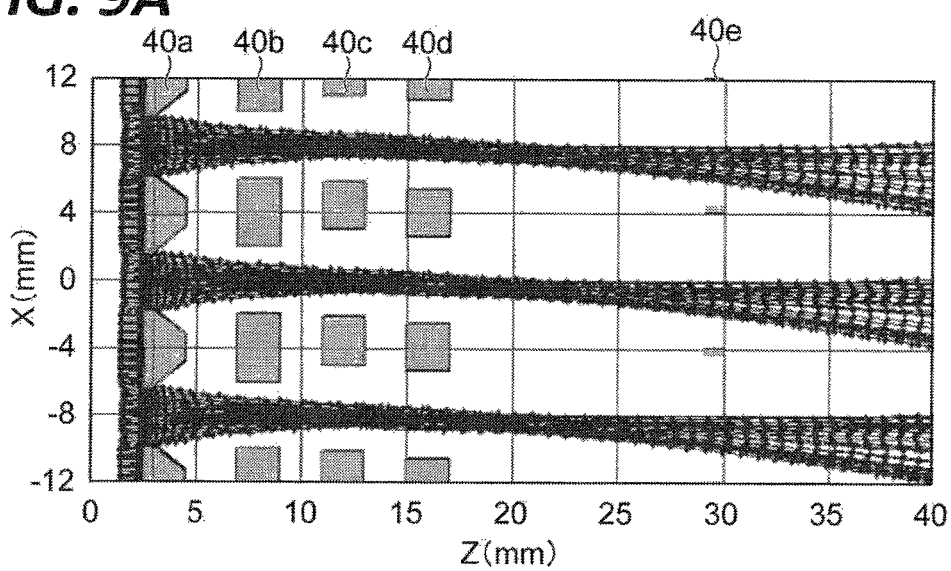
FIGS. 9A and 9B are simulation results of low energy ion beam steering.
Figure 9B:
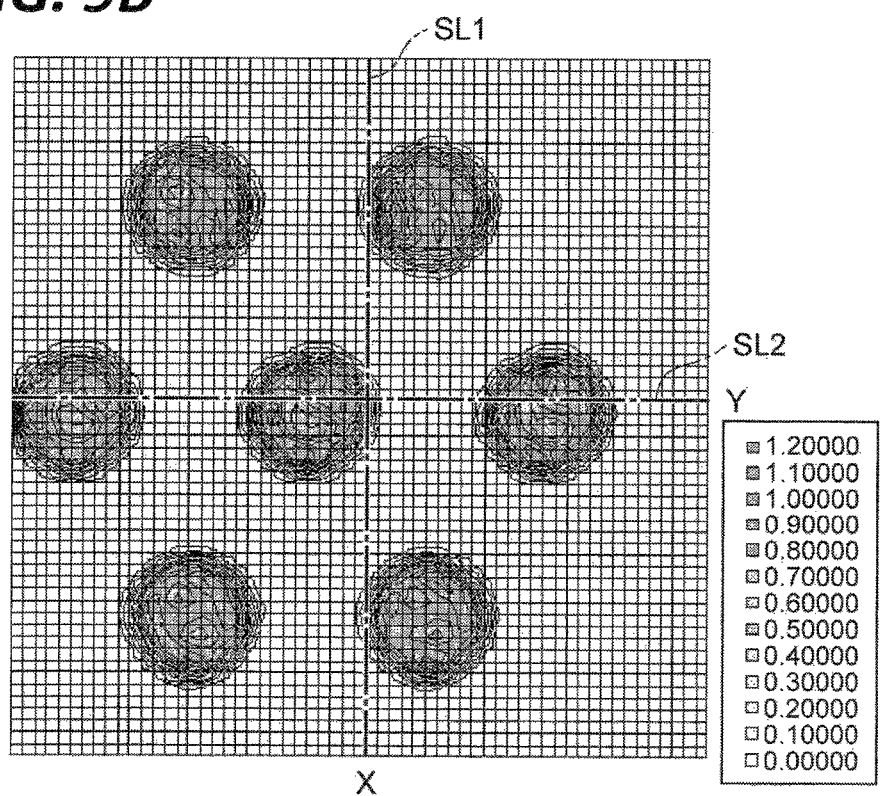

FIG. 9A is a simulation result of the ion beam when the voltage of the third grid electrode 40c is set to −900 V. FIG. 9B illustrates distribution of a beam current density ($A/m^2$) on the sample surface (XY plane), and the beam current density (0.00000 $A/m^2$ to 1.20000 $A/m^2$) is indicated by contour lines. Reference lines SL1 and SL2 indicate the central point of the aperture diameter of the first grid electrode 40a on the sample surface. The intersection point of the reference lines SL1 and SL2 corresponds to the point obtained by projecting the central point of the aperture diameter of the first grid electrode 40a on the sample surface. In FIGS. 9A and 9B, the potential difference based on the second grid electrode 40b is 400 V. That is, it is a potential difference at which ions accelerate. At this time, as illustrated in FIG. 9A, it was confirmed that the ion beam was tilted in the reverse direction of the offset direction (X negative direction). Further, as illustrated in FIG. 9B, it was confirmed that the beam spot position represented by the beam current density distribution was also positioned closer to the reverse direction of the offset direction (X negative direction) than the reference line SL1.

As illustrated in FIGS. 7A and 7B, 8A and 8B, and 9A and 9B, it has been confirmed that, even in the case of low energy ion beams, it is necessary to set the first potential difference to be negative when tilting the ion beams in the offset direction of the central axis of the apertures of the third grid electrode 40c, and set the first potential difference to be positive when tilting the ion beams in the reverse direction of the offset direction of the central axis of the apertures of the third grid electrode 40c.

As described above, in the ion beam irradiation apparatus and the substrate processing apparatus 1 according to the first exemplary embodiment, since the central axes of the apertures of the first grid electrode 40a and the second grid electrode 40b arranged on the plasma side are coaxial, the apparatus may extract beams having a good shape, compared to a case where the central axes of the apertures of the first grid electrode 40a and the second grid electrode 40b do not coincide. In addition, in the apparatus, the central axis of the aperture of the third grid electrode 40c to which a voltage is applicable is offset in the direction orthogonal to the beam irradiation direction with respect to the central axes of the aperture of the first grid electrode and the second grid electrode, and the electric field formed by the third grid electrode 40c is controlled by the controller 101. Therefore, the ion beam irradiation apparatus may shift (steer) beams having a good shape in two directions, that is, the offset direction of the third grid electrode and the reverse direction of the offset direction. That is, the ion beam irradiation apparatus may control the directionality of the entire ion beams by only controlling the voltage without influencing the convergence characteristics of the ion beams extracted from the plurality of apertures, respectively. Therefore, the ion beam irradiation apparatus may easily control the directionality of the entire ion beams extracted from the plurality of apertures.

Further, according to the ion beam irradiation apparatus and the substrate processing apparatus 1 according to the first exemplary embodiment, it is possible to use the first potential difference between the second grid electrode 40b and the third grid electrode 40c as a parameter, and control the entire ion beams extracted from the plurality of apertures in the offset direction of the third grid electrode or the reverse direction of the offset direction.

Further, according to the ion beam irradiation apparatus and the substrate processing apparatus 1 according to the first exemplary embodiment, it is possible to control the tilt angle of the entire ion beams extracted from the plurality of apertures with the first potential difference as a parameter.

Further, according to the ion beam irradiation apparatus and the substrate processing apparatus 1 according to the first exemplary embodiment, it is possible to control the tilt direction of the entire ion beams extracted from the plurality of apertures with the positive or negative value of the first potential difference as a parameter.

Second Exemplary Embodiment

An ion beam irradiation apparatus and a substrate processing apparatus according to a second exemplary embodiment are different from the ion beam irradiation apparatus and the substrate processing apparatus 1 according to the first exemplary embodiment in that one more grid electrode is added to the grid electrode 40, and in addition to the third grid electrode 40c, the fourth grid electrode 40d is also offset. Hereinafter, differences from the first exemplary embodiment will be mainly described, and redundant description will be omitted.

Figure 10:
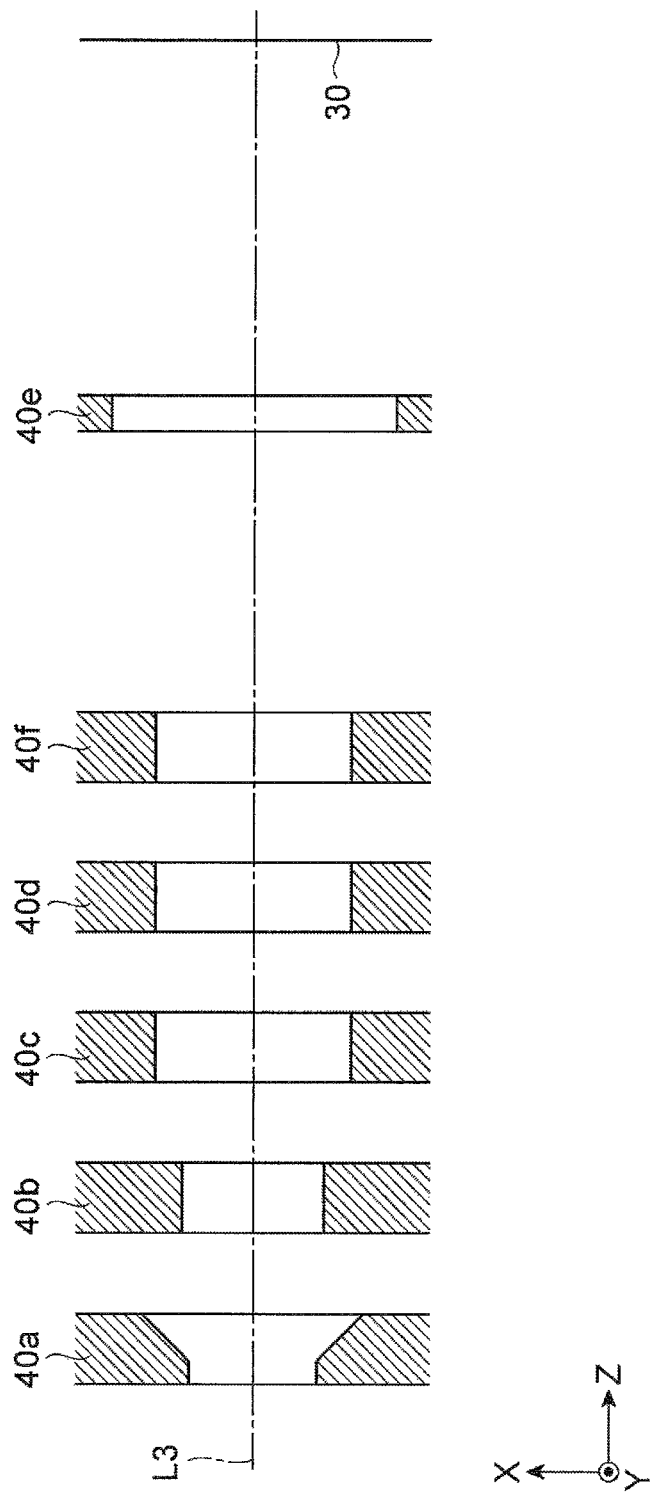
FIG. 10 is a view for explaining a positional relationship of apertures of grid electrodes according to a second exemplary embodiment.

FIG. 10 is a view for explaining a positional relationship of apertures of a grid electrode 40 according to a second exemplary embodiment. As illustrated in FIG. 10, a fifth grid electrode 40f is arranged on the downstream side of the fourth grid electrode 40d in the beam irradiation direction and the upstream side of the adjustment grid electrode 40e. The central axis of the aperture of the fourth grid electrode 40d is offset in a direction (Y direction) intersecting with the offset direction of the central axis of the aperture of the third grid electrode (X direction), as a direction orthogonal to the beam irradiation direction with respect to the central axes L3 of the apertures of the first grid electrode 40a and the second grid electrode 40b.

The fourth grid electrode 40d is different from the third grid electrode 40c only in the offset direction, and is the same as the third grid electrode 40c for the control of the directionality of the ion beam by voltage application. That is, the controller 101 imparts a second potential difference between the third grid electrode 40c and the fourth grid electrode 40d so as to tilt a plurality of ion beams irradiated from the plurality of apertures in the offset direction of the fourth grid electrode 40d or in the reverse direction of the offset direction. Further, the controller 101 controls the second potential difference to become large as a target tilt angle is increased when tilting the plurality of ion beams in the offset direction of the fourth grid electrode 40d or the reverse direction of the offset direction. Further, the controller 101 sets the second potential difference to be negative when tilting the ion beams in the offset direction of the central axis of the apertures of the fourth grid electrode 40d, and sets the second potential difference to be positive when tilting the ion beams in the reverse direction of the offset direction of the central axis of the apertures of the fourth grid electrode 40d. When the fifth grid electrode 40f is added in this manner, an arbitrary voltage may be applied by offsetting the fourth grid electrode 40d. Thus, it is possible to perform a control in a direction different from that of the third grid electrode 40c. That is, the irradiation direction of the ion beams may be set at an arbitrary position in the two-dimensional plane.

Figure 11:
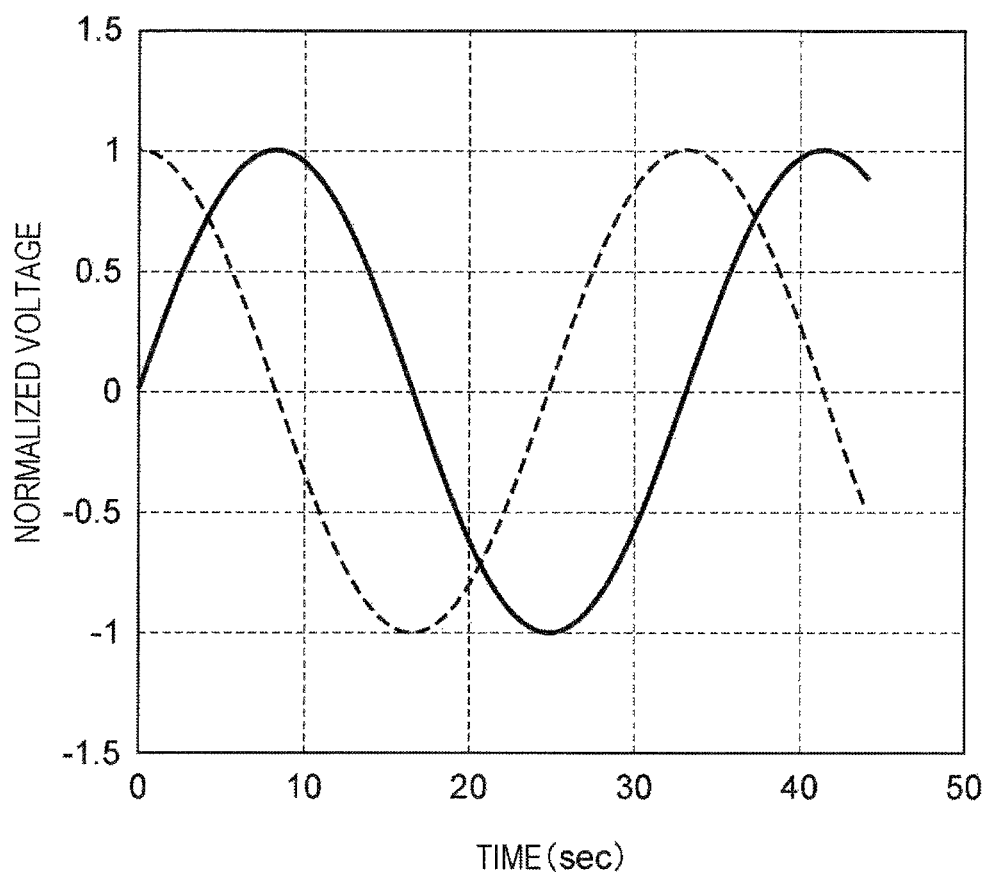
FIG. 11 is an example of a voltage control for controlling a tilting direction of an ion beam in a plane orthogonal to a beam irradiation direction.
Figure 12:
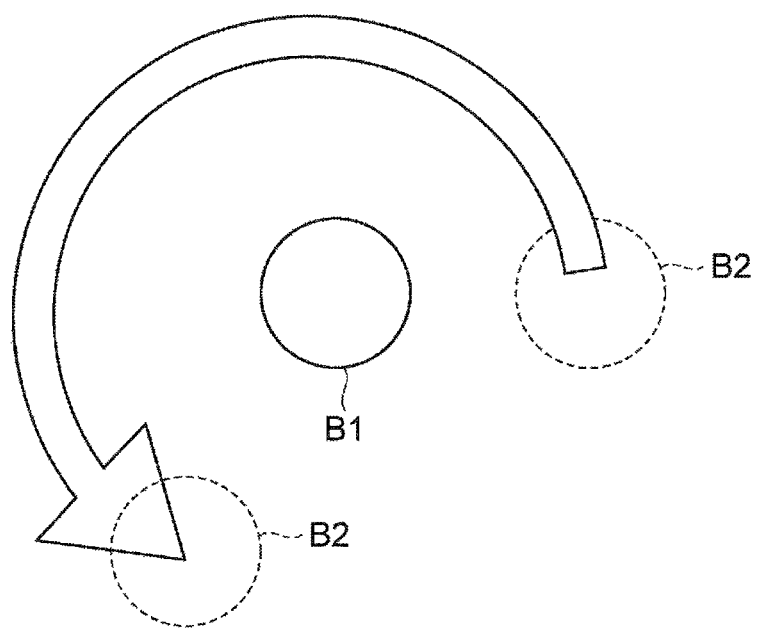
FIG. 12 is a view for explaining an irradiation position of the ion beam in a case where the ion beam is controlled with the voltage illustrated in FIG. 11.

FIG. 11 is an example of a voltage control for controlling an ion beam tilting direction of an ion beam in a plane orthogonal to a beam irradiation direction. The broken line illustrated in FIG. 11 indicates a voltage applied to the third grid electrode 40c, and the solid line indicates a voltage applied to the fourth grid electrode 40d. Such a profile is stored in advance in the storage unit 102. FIG. 12 is a view for explaining an irradiation position of the ion beam in a case where the ion beam is controlled with the voltage illustrated in FIG. 11. When the ion beam is not tilted, the ion beam is irradiated to an irradiation position B1. Meanwhile, in the case where the control is performed by applying a voltage that features a sine curve with a period shifted as illustrated in FIG. 11, an irradiation position B2 of the ion beam may be rotated in the direction indicated by the arrow in the figure. That is, the irradiation direction of the ion beams may be set at an arbitrary position in the two-dimensional plane by controlling the magnitude and period of the voltage.

As described above, the ion beam irradiation apparatus and the substrate processing apparatus according to the second exemplary embodiment have the same effect as that of the ion beam irradiation apparatus and the substrate processing apparatus according to the first exemplary embodiment, and may freely control the entire ion beams extracted from the plurality of apertures in a plane orthogonal to the beam irradiation direction.

[Modification 1]

Figure 13:
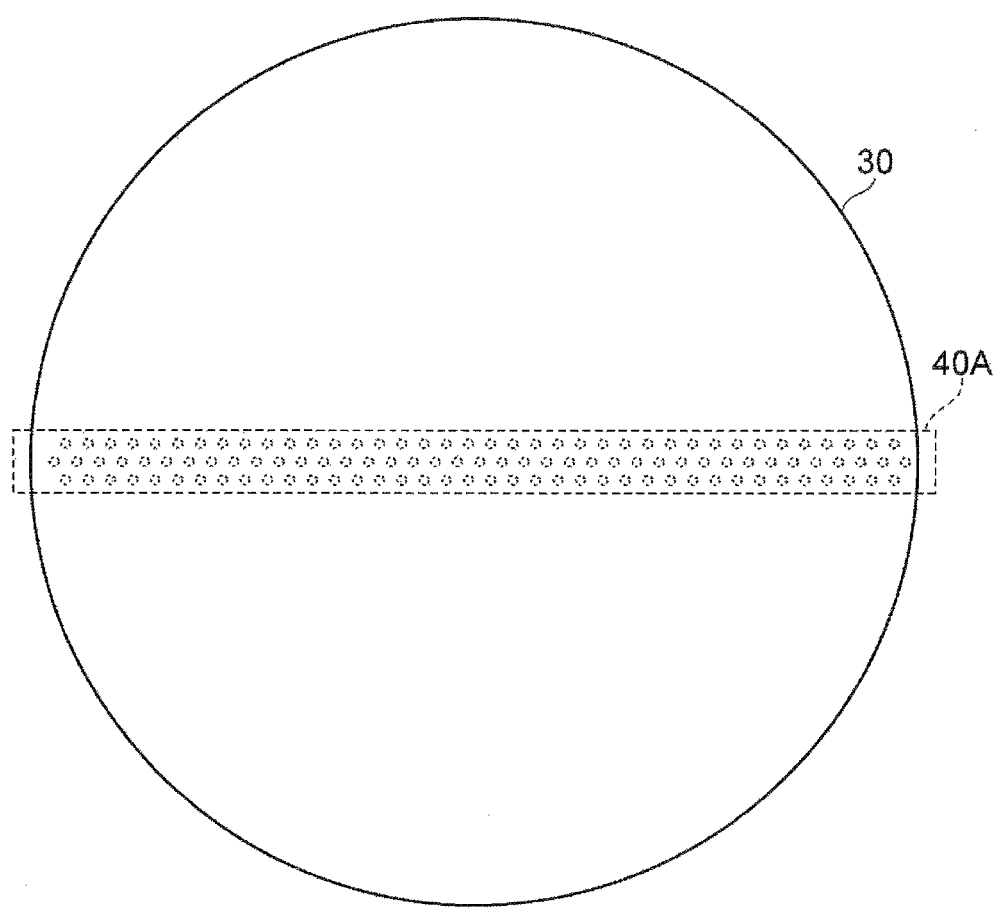
FIG. 13 is a view for explaining a relationship between a region where apertures are formed and a placing surface of a placing table.

In the first exemplary embodiment described above, descriptions have been made on the case where the grid electrode 40 is circular. However, the grid electrode is not limited to the circular shape, and may have a rectangular shape or a square shape. FIG. 13 is a view for explaining a relationship between a region where apertures are formed and a placing surface of a placing table. As illustrated in FIG. 13, the region where the plurality of apertures in the grid electrode are formed may be made smaller than the area of the placing surface by using the function of controlling the direction of the ion beam according to the present disclosure. The shape of the region is, for example, a quadrangle that is long in one direction. With such a configuration, it is not necessary to enlarge the region where the plurality of apertures are formed according to the size of the substrate. Therefore, it is possible to appropriately maintain the degree of vacuum of the plasma chamber, and to cope with a substrate of an arbitrary size without changing the apparatus configuration.

[Modification 2]

In the above-described exemplary embodiments, descriptions have been made on an example in which the third grid electrode 40c is arranged third from the plasma in the beam irradiation direction, and the fourth grid electrode 40d is arranged fourth from the plasma toward the beam irradiation direction. However, the present disclosure is not limited thereto. That is, an arbitrary number of grid electrodes may be inserted between the second grid electrode 40b and the third grid electrode 40c and between the third grid electrode 40c and the fourth grid electrode 40d.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An ion beam irradiation apparatus which extracts and irradiates an ion beam from plasma, the apparatus comprising: a plurality of plate-like grid electrodes arranged in a beam irradiation direction so as to overlap with each other and each having a plurality of circular apertures; a power supply unit that applies a voltage to each of the grid electrodes; and a controller that controls the voltage applied to each of the grid electrodes by the power supply unit, wherein the plurality of grid electrodes include a first grid electrode and a second grid electrode arranged first and second from the plasma in the beam irradiation direction and a third grid electrode and a fourth grid electrode arranged on a downstream side of the second grid electrode in the beam irradiation direction, in this order, central axes of the plurality of circular apertures of the first grid electrode and the plurality of circular apertures of the second grid electrode are coaxial along the beam irradiation direction, and central axes of the plurality of circular apertures of the third grid electrode are each offset in a direction orthogonal to the beam irradiation direction with respect to the central axes of the plurality of circular apertures of the first grid electrode and the second grid electrode.

2. The ion beam irradiation apparatus of claim 1, wherein the controller imparts a first potential difference between a grid electrode closest to the third grid electrode on an upstream side of the third grid electrode in the beam irradiation direction, among the plurality of grid electrodes, and the third grid electrode so as to tilt a plurality of ion beams irradiated from the plurality of circular apertures in an offset direction of the third grid electrode or in a reverse direction of the offset direction.

3. The ion beam irradiation apparatus of claim 2, wherein the controller controls the first potential difference to become large as a target tilt angle is increased when tilting the plurality of ion beams in the offset direction of the third grid electrode or the reverse direction of the offset direction.

4. The ion beam irradiation apparatus of claim 1, further comprising: a fifth grid electrode arranged on a downstream side of the fourth grid electrode in the beam irradiation direction, wherein central axes of the plurality of circular apertures of the fourth grid electrode are each offset in a direction intersecting with the offset direction of the central axes of the plurality of circular apertures of the third grid electrode, as a direction orthogonal to the beam irradiation direction with respect to the central axes of the plurality of circular apertures of the first grid electrode and the second grid electrode.

5. The ion beam irradiation apparatus of claim 4, wherein the controller imparts a second potential difference between a grid electrode closest to the fourth grid electrode on an upstream side of the fourth grid electrode in the beam irradiation direction, among the plurality of grid electrodes, and the fourth grid electrode so as to tilt a plurality of ion beams irradiated from the plurality of circular apertures in an offset direction of the fourth grid electrode or in a reverse direction of the offset direction.

6. The ion beam irradiation apparatus of claim 5, wherein the controller controls the second potential difference to become large as a target tilt angle is increased when tilting the plurality of ion beams in the offset direction of the fourth grid electrode or the reverse direction of the offset direction.

7. The ion beam irradiation apparatus of claim 5, wherein the controller sets the second potential difference to be negative when tilting the ion beams in the offset direction of the central axes of the plurality of circular apertures of the fourth grid electrode, and sets the second potential difference to be positive when tilting the ion beams in the reverse direction of the offset direction of the central axes of the plurality of circular apertures of the fourth grid electrode.

8. A substrate processing apparatus comprising:
   the ion beam irradiation apparatus of claim 1; and
   a placing table arranged in a beam irradiation direction of the ion bean irradiation apparatus and having a placing surface on which a substrate is held.

9. The substrate processing apparatus of claim 8, wherein a region in which the plurality of circular apertures are formed in a grid electrode is smaller than an area of the placing surface of the placing table and has a shape of a quadrangle that is long in one direction.

10. The substrate processing apparatus of claim 1, wherein central axes of the plurality of apertures of the fourth grid electrode are each offset in a direction orthogonal to the beam irradiation direction while intersecting with an offset direction of the central axes of the plurality of apertures of the third grid electrode.

11. The substrate processing apparatus of claim 1, wherein one or more grid electrodes are provided between the second grid electrode and the third grid electrode, and
   one or more grid electrodes are provided between the third grid electrode and the fourth grid electrode.

12. An ion beam irradiation apparatus which extracts and irradiates an ion beam from plasma, the apparatus comprising: a plurality of plate-like grid electrodes arranged in a beam irradiation direction so as to overlap with each other and each having a plurality of apertures; a power supply unit that applies a voltage to each of the grid electrodes; and a controller that controls the voltage applied to each of the grid electrodes by the power supply unit, wherein the plurality of grid electrodes include a first grid electrode and a second grid electrode arranged first and second from the plasma in the beam irradiation direction and a third grid electrode and a fourth grid electrode arranged on a downstream side of the second grid electrode in the beam irradiation direction, in this order, central axes of apertures of the first grid electrode and apertures of the second grid electrode are coaxial along the beam irradiation direction, and central axes of apertures of the third grid electrode are each offset in a direction orthogonal to the beam irradiation direction with respect to the central axes of the apertures of the first grid electrode and the second grid electrode, wherein the controller imparts a first potential difference between a grid electrode closest to the third grid electrode on an upstream side of the third grid electrode in the beam irradiation direction, among the plurality of grid electrodes, and the third grid electrode so as to tilt a plurality of ion beams irradiated from the plurality of apertures in an offset direction of the third grid electrode or in a reverse direction of the offset direction; and the controller sets the first potential difference to be negative when tilting the ion beams in the offset direction of the central axes of the apertures of the third grid electrode, and sets the first potential difference to be positive when tilting the ion beams in the reverse direction of the offset direction of the central axes of the apertures of the third grid electrode.

* * * * *